United States Patent
Kim et al.

(10) Patent No.: US 11,145,768 B2
(45) Date of Patent: Oct. 12, 2021

(54) TRENCH CAPACITOR COMPONENT WITH REDUCED EQUIVALENT SERIES RESISTANCE AND EQUIVALENT SERIES INDUCTANCE

(71) Applicant: QUALCOMM Incorporated, San Diego, CA (US)

(72) Inventors: Jonghae Kim, San Diego, CA (US); Periannan Chidambaram, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1 day.

(21) Appl. No.: 16/782,865

(22) Filed: Feb. 5, 2020

(65) Prior Publication Data
US 2021/0242353 A1    Aug. 5, 2021

(51) Int. Cl.
*H01L 29/66*   (2006.01)
*H01L 29/94*   (2006.01)
*H01L 23/522*  (2006.01)
*H01L 27/08*   (2006.01)
*H01L 21/768*  (2006.01)

(52) U.S. Cl.
CPC ...... *H01L 29/945* (2013.01); *H01L 21/76879* (2013.01); *H01L 23/5223* (2013.01); *H01L 27/0805* (2013.01); *H01L 29/66181* (2013.01)

(58) Field of Classification Search
CPC ......... H01L 27/10829; H01L 27/10861; H01L 29/66181; H01L 29/945
See application file for complete search history.

(56) References Cited

U.S. PATENT DOCUMENTS

2016/0095221 A1 *   3/2016   Ramachandran .... H05K 3/4038
                                                       361/783

* cited by examiner

*Primary Examiner* — Hoai V Pham
(74) *Attorney, Agent, or Firm* — Patterson & Sheridan, L.L.P.

(57) ABSTRACT

Certain aspects of the present disclosure generally relate to a capacitive element. One example capacitive element generally includes a substrate, a plurality of trench capacitors, an electrically conductive via, a first electrically conductive contact, and a second electrically conductive contact. The trench capacitors intersect the substrate. The electrically conductive via intersects the substrate and is disposed adjacent to at least one of the trench capacitors. The first electrically conductive contact is disposed above the substrate, and the second electrically conductive contact is disposed below the substrate and electrically coupled to the plurality of trench capacitors through the electrically conductive via.

20 Claims, 6 Drawing Sheets

TRENCH CAPACITOR COMPONENT WITH REDUCED EQUIVALENT SERIES RESISTANCE AND EQUIVALENT SERIES INDUCTANCE

BACKGROUND

Field of the Disclosure

Certain aspects of the present disclosure generally relate to electronic components and, more particularly, to a capacitive element implemented with trench capacitors.

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices.

In some cases, an IC is powered by a voltage regulator that converts available wall voltages to the lower voltages used by the IC. The voltage regulator ensures a predictable power supply is provided to the IC. As transistors in the IC turn on and off, the power load changes rapidly placing additional demand on the voltage regulator. The distance between the voltage regulator and the IC creates a long response time, preventing the voltage regulator from increasing power to the IC instantaneously, especially when the transistors switch on and off millions or billions of times each second. Decoupling capacitors provide additional stability to the power supplied to the IC. For instance, decoupling capacitors may reduce IC electrical impedance to ground for high-frequency transients and enable the IC to maintain a near-constant voltage across all operating frequencies.

Decoupling capacitors attached in close proximity to the IC provide a local charge reservoir for the IC. As demand on the power supply changes rapidly, the capacitor provides a localized supply of power and can recharge at a later time when the power demand decreases. However, as transistor sizes have decreased and transistor densities have increased, finding area on the IC for decoupling capacitors has become increasingly challenging. In certain cases, capacitors (e.g., metal-oxide-semiconductor (MOS) capacitors) are built from thick oxide transistors commonly used for input/output (I/O) transistors. These capacitors are fabricated on the substrate to provide decoupling capacitance for the circuitry on the substrate. Thick oxide transistors offer very small values of capacitance in comparison to the large amounts of substrate area they consume that could otherwise be used for other circuitry. In some cases, the capacitors (e.g., deep trench capacitors) are formed from an array of deep trenches in a substrate and filled with an electrical insulator (e.g., a dielectric) between layers of electrodes. In other cases, the capacitors are attached on the land side under the IC die shadow (land-side capacitor: LSC) or adjacent to the die side (die-side capacitor: DSC), where the capacitors are used for the reduction of the impedance at high frequency.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include an improved capacitive element.

Certain aspects of the present disclosure provide a capacitive element. The capacitive element generally includes a substrate, a plurality of trench capacitors, an electrically conductive via, a first electrically conductive contact, and a second electrically conductive contact. The trench capacitors intersect the substrate. The electrically conductive via intersects the substrate and is disposed adjacent to at least one of the trench capacitors. The first electrically conductive contact is disposed above the substrate, and the second electrically conductive contact is disposed below the substrate and electrically coupled to the plurality of trench capacitors through the electrically conductive via.

Certain aspects of the present disclosure provide a method of fabricating a capacitive element. The method generally includes forming a plurality of trench capacitors that intersect a substrate, forming an electrically conductive via that intersects the substrate and is adjacent to at least one of the trench capacitors, forming a first electrically conductive contact above the substrate, and forming a second electrically conductive contact below the substrate and electrically coupled to the plurality of trench capacitors through the electrically conductive via.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to a capacitive element and a method of fabricating a capacitive element.

In the micro-electronic technology industry, there is a continuous demand and evolution of processes, technologies, and assembly methodologies to design and implement smaller, more efficient integrated circuit (IC) packages (also referred to as a chip package). A power distribution network (PDN) is used to deliver power from a power supply/source to the integrated circuit(s) in a chip package. However, the PDN inherently suffers from noise and/or resonance, which interfere with the integrated circuits that the PDN is meant to power. For instance, excessive voltage drops in the power grid may reduce switching speeds and noise margins of semiconductor devices in the integrated circuit packages. Excessive voltage drops may also inject noise which may lead to functional failures of the semiconductor devices. Passive electrical devices, such as decoupling capacitors, may be used on the integrated circuit package to improve the PDN by providing local storage of charge that reduces the voltage drop encountered at the integrated circuit die(s).

The decoupling capacitor may be a trench capacitor component implemented as an array of high-density trench capacitors. In certain cases, the trench capacitor component may have an equivalent series resistance (ESR) and equivalent series inductance (ESL) that affect the power distribution to various integrated circuits of the chip package. For example, the trench capacitor component may be electrically coupled to the land side of a package-on-package assembly via conductive contacts disposed only on the top surface of the trench capacitor component. With only top surface contacts, the trench capacitor component may lack an effective ground plane that typically reduces electrical noise and may decrease the ESR and ESL of the trench capacitor component. The trench capacitor component may also be electrically coupled to external circuitry (such as a circuit board, motherboard, or another chip or wafer) through a redistribution layer (RDL) and solder bumps of the chip assembly. In such a case, the indirect routing through the redistribution layer may increase the impedance to the trench capacitor component.

Certain aspects of the present disclosure generally relate to a capacitive element (e.g., a trench capacitor component) with conductive contacts disposed above and below a substrate. With the conductive contacts disposed above and below the substrate, the capacitive element may enable reduced ESR and ESL due to a more effective ground plane and electrical routing through the capacitive element.

Figure 1A:
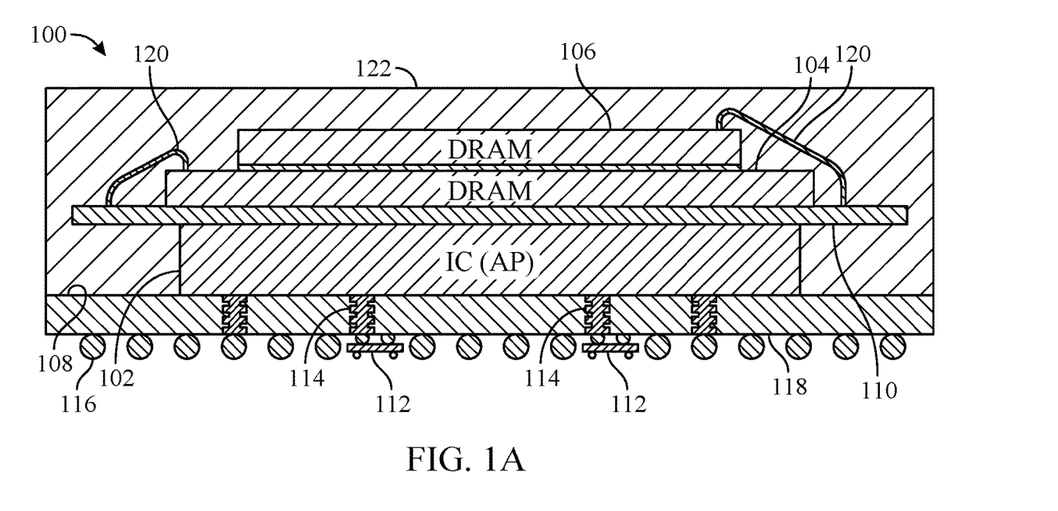
FIG. 1A illustrates a cross-sectional view of an example integrated circuit (IC) package assembly having a capacitive element, in accordance with certain aspects of the present disclosure.

In certain aspects, a package-on-package chip assembly (also referred to herein as an IC package) may employ one or more capacitive elements, as further described herein, as a decoupling capacitor. For example, FIG. 1A is a cross-sectional view of an example chip assembly 100 having a capacitive element, in accordance with certain aspects of the present disclosure. As shown, the chip assembly 100 may include a first integrated circuit die 102 (also referred to as the first die), one or more second integrated circuit die(s) 104, 106 (also referred to as the second dies), redistribution layers 108, interposer layers 110, and one or more capacitive elements 112. The chip assembly 100 may be, for example, a fan-out wafer-level package-on-package assembly.

The first die 102 may be, for example, a processor or an application processor such as the processor of a system-on-a-chip (SoC). The first die 102 is disposed between the redistribution layers 108 and the interposer layers 110.

Figure 1B:
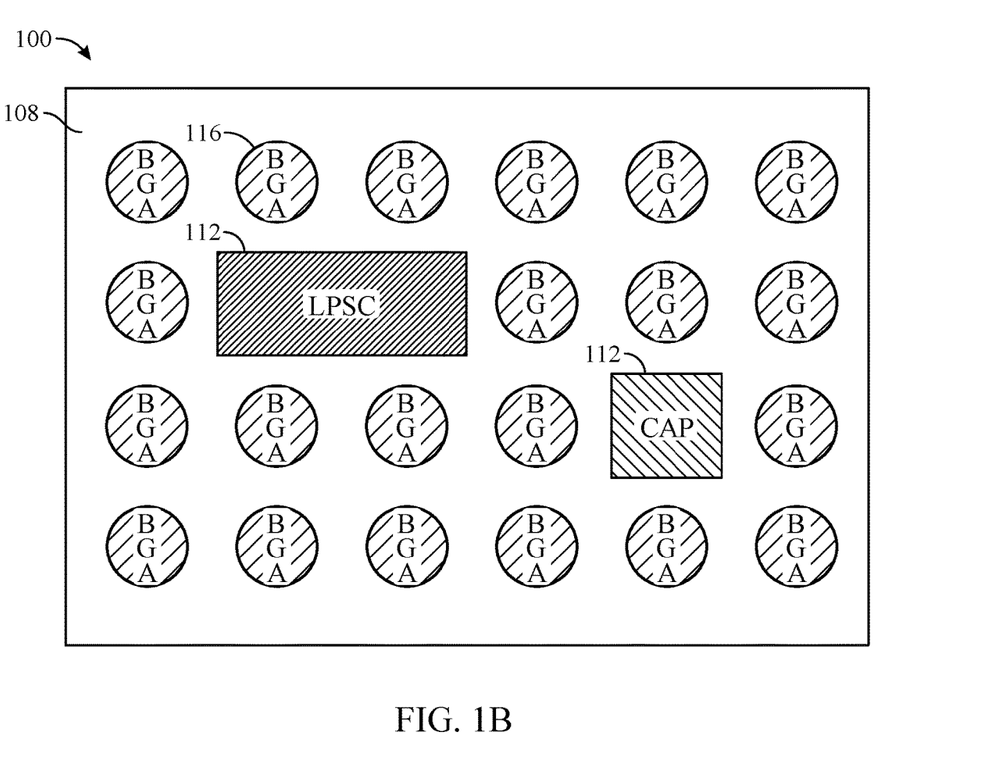
FIG. 1B illustrates a bottom view of the IC package assembly of FIG. 1A, in accordance with certain aspects of the present disclosure.

The redistribution layers 108 may provide access to the input/output (I/O) of the first die 102. The redistribution layers 108 may include electrical routing 114, such as conductive traces and vias, embedded in the redistribution layers 108. Solder bumps 116 may be disposed below the redistribution layers 108 and electrically coupled to the I/O pins of the first die 102 through the electrical routing 114 of the redistribution layers 108. The solder bumps 116 may enable the chip assembly 100 to be mounted and electrically coupled to external circuitry (not shown), such as a circuit board, motherboard, or another chip or wafer. The solder bumps 116 may form a solder ball grid array with the capacitive elements 112 disposed adjacent to a portion of the solder bumps 116, for example, as depicted in FIG. 1B illustrating a bottom view of the chip assembly 100.

In certain aspects, the capacitive elements 112 may be coupled to a land side surface 118 of the redistribution layers 108. In other words, the capacitive elements 112 are disposed on a land side of an IC package (e.g., the chip assembly 100) between electrical contacts (e.g., the solder bumps 116) extending from a surface (the land side surface 118) of the IC package. The capacitive elements 112 may serve as decoupling capacitors for the circuitry of the first die 102 and/or second dies 104, 106. For example, the capacitive elements 112 may be electrically coupled to the circuitry of the first die 102 and/or second dies 104, 106 through the electrical routing 114 of the redistribution layers 108. The land-side positioning of the capacitive elements 112 may enable a reduction in parasitic effects encountered at the first die 102 and/or second dies 104, 106 due to the close proximity of the capacitive elements 112 to the circuitry of the first die 102 and/or second dies 104, 106. In certain cases, the capacitive elements 112 may improve the power delivery to the first die 102 and/or second dies 104, 106. As further described herein with respect to FIGS. 2A-2C, the capacitive elements 112 may have electrically conductive contacts (not shown) disposed above and below a substrate layer (not shown). The conductive contacts on the bottom surface of the capacitive elements 112 may enable direct electrical coupling to the external circuitry to which the solder bumps 116 are also coupled. In such a case, the electrical routing to the capacitive elements 112 may be reduced, which in turn reduces the impedances encountered at the chip assembly 100.

The interposer layers 110 are disposed between the first die 102 and the second dies 104, 106. The interposer layers 110 include electrical routing that provides access to the I/O pins of the second dies 104, 106. For example, the first die 102 may be electrically coupled to the second dies 104, 106 through the interposer layers 110.

The second dies 104, 106 are disposed above the interposer layer 110. In certain cases, the second dies 104, 106 include memory chips (e.g., dynamic random access memory (DRAM) chips) that are electrically coupled to the first die 102. In aspects, conductive wiring 120 (e.g., wire bonding) may be electrically coupled to the second dies 104, 106 and the interposer layers 110. The conductive wiring 120 may provide access to the frontside of the second dies 104, 106.

In certain aspects, a molding compound 122 may be disposed above the redistribution layers 108 and surround the first die 102, the interposer layers 110, and the second dies 104, 106. The molding compound 122 may serve as a structural support that encapsulates the first die 102, the interposer layers 110, and the second dies 104, 106. In aspects, the molding compound 122 may also prevent or at least reduce physical damage and corrosion of the electrical components of the chip assembly 100.

Example Trench Capacitor Component

Figure 2A:
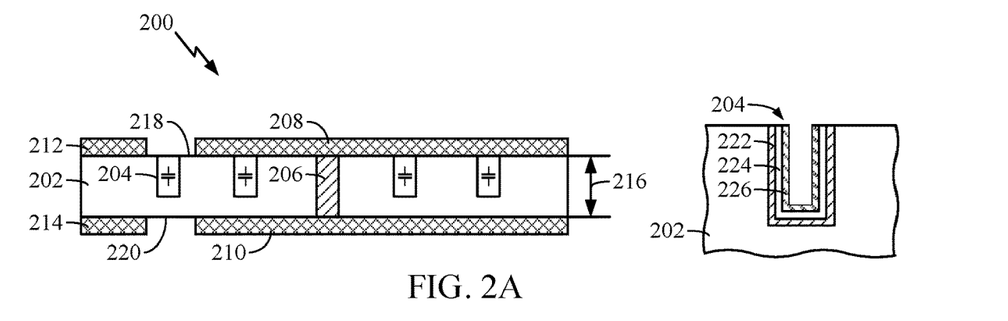
FIG. 2A illustrates a cross-sectional view of an example capacitive element, in accordance with certain aspects of the present disclosure.

FIG. 2A illustrates a cross-sectional view of an example capacitive element, in accordance with certain aspects of the present disclosure. As shown, the capacitive element 200 includes a substrate 202, a plurality of trench capacitors 204, a first electrically conductive via 206, a first electrically conductive contact 208, and a second electrically conductive contact 210. In certain aspects, the capacitive element 200 may further include a second electrically conductive via (not shown), a third electrically conductive contact 212, and a fourth electrically conductive contact 214.

The substrate 202 may be a portion of a semiconductor wafer, such as a silicon wafer. In certain aspects, the substrate 202 may include a dielectric material such as silicon dioxide ($SiO_2$). The substrate 202 may serve as a base on which the various elements of the capacitive element 200 are formed. The substrate 202 may have a thickness 216 between a top surface 218 and a bottom surface 220.

The trench capacitors 204 may be metal-insulator-metal (MIM) capacitors formed in trenches that intersect the substrate 202. Each of the trench capacitors 204 may include a first electrically conductive layer 222, a first dielectric layer 224, and a second electrically conductive layer 226. The first dielectric layer 224 may be disposed between the first and second conductive layers 222, 226, which serve as the electrodes of each trench capacitor 204. In aspects, the first dielectric layer 224 may include any suitable dielectric material such as silicon dioxide ($SiO_2$). In certain aspects, the first dielectric layer 224 may include a high-κ dielectric having a dielectric constant (κ) greater than silicon dioxide ($SiO_2$) (e.g., κ=3.9), including, for example, aluminum oxide ($Al_2O_3$), hafnium dioxide ($HfO_2$), zirconium dioxide ($ZrO_2$), and/or titanium dioxide ($TiO_2$). The trench capacitors 204 may extend from the top surface 218 of the substrate 202 only partially through the thickness 216 of the substrate 202. The trench capacitors 204 may be arranged in an array in the substrate 202 and electrically coupled together (e.g., in parallel) to produce an equivalent capacitance of the capacitive element 200.

The first conductive via 206 includes an electrically conductive material that intersects the substrate 202. The electrically conductive material may include various metal alloys or metals including aluminum (Al), chromium (Cr), cobalt (Co), copper (Cu), tantalum (Ta), titanium (Ti), tungsten (W), etc. In aspects, the first conductive via 206 may be a through-silicon via (TSV) that spans the thickness 216 of the substrate 202. The first conductive via 206 may be disposed adjacent to at least one of the trench capacitors 204.

The conductive contacts 208, 210, 212, 214 include an electrically conductive material disposed above or below the substrate 202. The first and third conductive contacts 208, 212 are disposed above the substrate 202, and the second and fourth conductive contacts 210, 214 are disposed below the substrate 202.

The second conductive contact 210 is electrically coupled to the trench capacitors 204 through the first electrically conductive via 206. In aspects, the first conductive contact 208 may be electrically coupled to the second conductive contact 210 through the first electrically conductive via 206. In certain aspects, the first and second conductive contacts 208, 210 may be electrical ground planes due to the first and second conductive contacts 208, 210 being electrically coupled to an electrical ground of a circuit, such as a ground of the chip assembly 100. For example, the first and second conductive contacts 208, 210 may be electrically coupled to the first conductive layer 222 of the trench capacitors 204. As electrical ground planes, the first and second conductive contacts 208, 210 may reduce electrical interference and noise affecting the capacitive element 200. As such, the capacitive element 200 may have a reduced ESR and ESL that improves the power delivery to a circuit, such as the circuitry of the chip assembly 100.

Figure 2B:
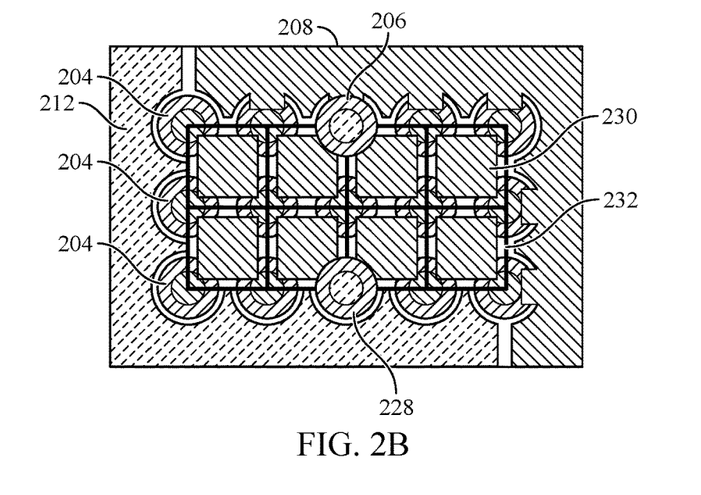
FIGS. 2B and 2C illustrate a top view and bottom view, respectively, of the capacitive element of FIG. 2A, in accordance with certain aspects of the present disclosure.
Figure 2C:
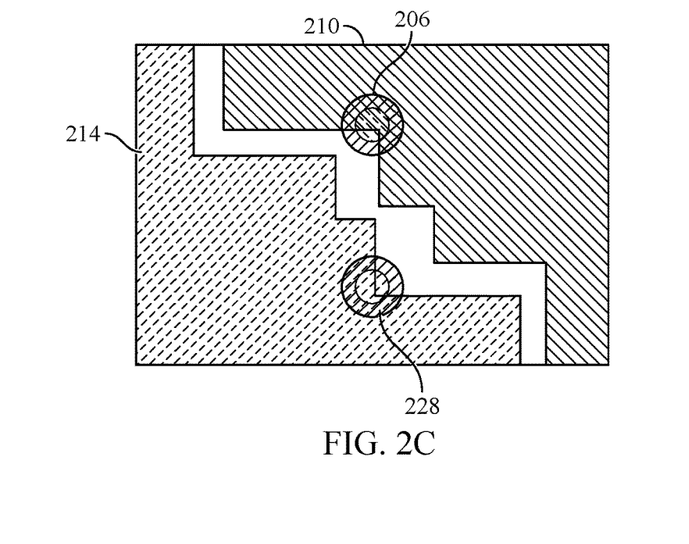

FIGS. 2B and 2C illustrate a top view and bottom view, respectively, of the capacitive element 200, in accordance with certain aspects of the present disclosure. As shown in FIGS. 2B and 2C, the capacitive element 200 may include the second conductive via 228 that intersects the substrate 202 and is electrically coupled to the trench capacitors 204 through the third conductive contact 212. For example, the third conductive contact 212 may be electrically coupled to the second conductive layer 226 of the trench capacitors 204. The fourth conductive contact 214 may be electrically coupled to the trench capacitors 204 through the second conductive via 228. For example, the fourth conductive contact 214 may be electrically coupled to the second conductive layer 226 of the trench capacitors 204.

Referring to FIG. 2B, the first conductive contact 208 may include multiple conductive pads 230 arranged adjacent to and electrically coupled to the trench capacitors 204, for example, the first conductive layer 222 of the trench capacitors 204. The third conductive contact 212 may include multiple conductive traces 232 arranged adjacent to and electrically coupled to the trench capacitors 204, for example, the second conductive layer 226 of the trench capacitors 204. The conductive traces 232 may form a grid, which may surround individual conductive pads 230, as shown.

Referring to FIG. 2C, the second conductive contact 210 may cover a first portion of the bottom surface 220 of the substrate 202, and the fourth conductive contact 214 may cover a second portion of the bottom surface 220 of the substrate 202. The fourth conductive contact 214 may be electrically coupled to the third conductive contact 212 through the second conductive via 228.

Figure 3A:
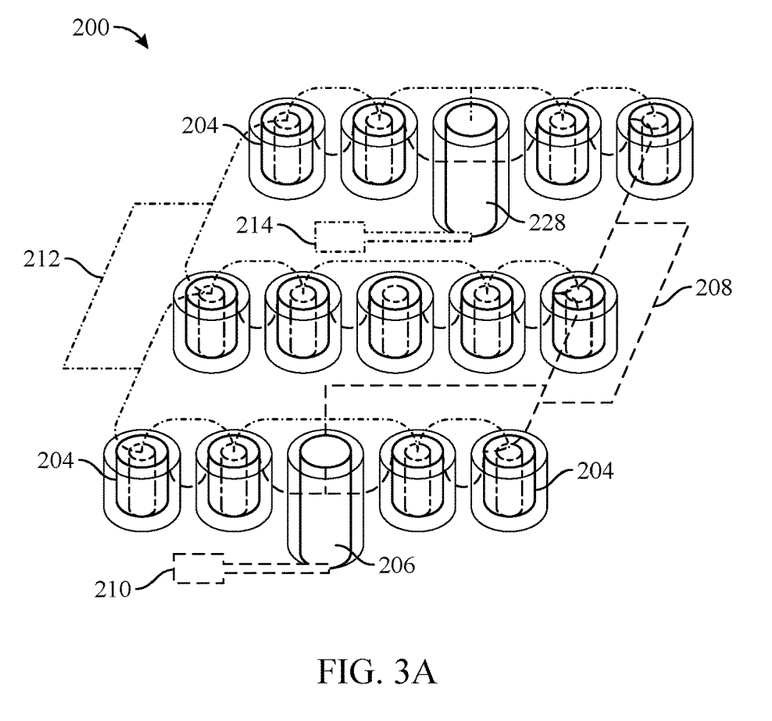
FIG. 3A illustrates a conceptual diagrammatic view of the example capacitive element of FIG. 2A, in accordance with certain aspects of the present disclosure.

FIG. 3A illustrates a conceptual diagrammatic view of the example capacitive element 200 of FIGS. 2A-2C, in accordance with certain aspects of the present disclosure. As shown, the first and second conductive contacts 208, 210 may be electrically coupled to each other through the first conductive via 206, and the third and fourth conductive contacts 212, 214 may be electrically coupled to each other through the second conductive via 228.

Figure 3B:
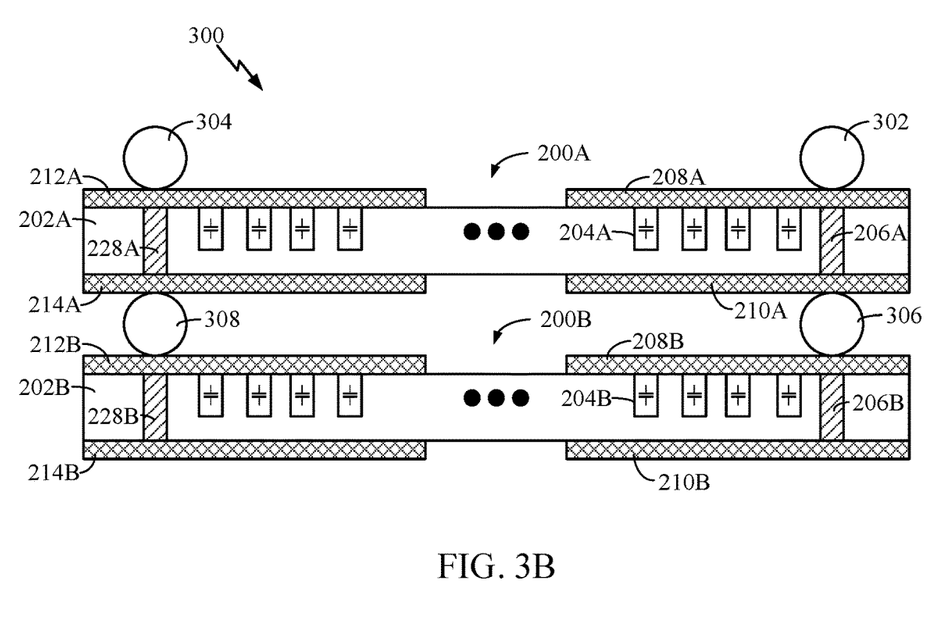
FIG. 3B illustrates a cross-sectional view of example stacked capacitive elements, in accordance with certain aspects of the present disclosure.

In certain aspects, the capacitive element may include a plurality of capacitive elements coupled together in a stacked arrangement. For example, FIG. 3B illustrates a cross-sectional view of stacked capacitive elements, in accordance with certain aspects of the present disclosure. As shown, the capacitive element 300 may include a first capacitive element 200A and a second capacitive element 200B coupled together in a stacked arrangement. Solder bumps 302, 304 may be disposed above the first and third conductive contacts 208A, 212A of the first capacitive element 200A, respectively, and solder bumps 306, 308 may be disposed above the first and third conductive contacts 208B, 212B of the second capacitive element 200B, respectively. In aspects, the first conductive contact 208B of the second capacitive element 200B may be electrically coupled to the second conductive pad 210A of the first capacitive element 200A through the sold bump 306. In certain aspects, the third conductive pad 212B of the second capacitive element 200B may be electrically coupled to the fourth conductive pad 214A of the first capacitive element 200A through the solder bump 308. In other words, the solder bumps 306, 308 may be disposed between the first and second capacitive elements 200A, 200B.

FIGS. 4A-4F illustrate example operations for fabricating a capacitive element, in accordance with certain aspects of the present disclosure. The operations may be performed by a semiconductor fabrication facility, for example.

Figure 4A:
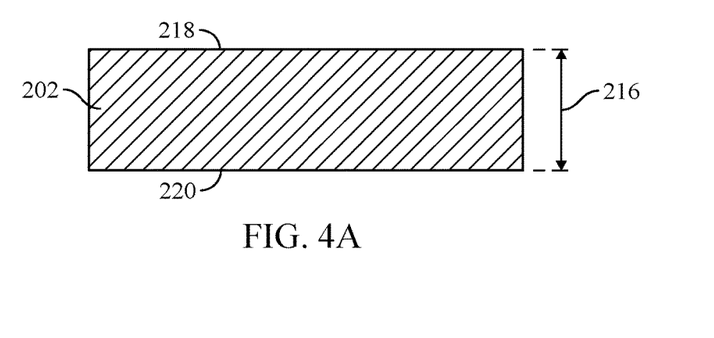
FIGS. 4A-4F illustrate example operations for fabricating a capacitive element, in accordance with certain aspects of the present

As shown in FIG. 4A, a substrate 202 may be formed. In certain cases, a boule of a semiconductor (e.g., silicon) may be formed and sliced into individual wafers. The substrate 202 may be a portion of a semiconductor wafer, such as a silicon wafer. In certain cases, the substrate 202 or a portion of the substrate 202 (e.g., a layer of the substrate 202) may be formed into an electrical insulator, such as a dielectric. For example, the substrate 202 or portion of the substrate 202 may be formed into a silicon dioxide ($SiO_2$) layer.

Figure 4B:
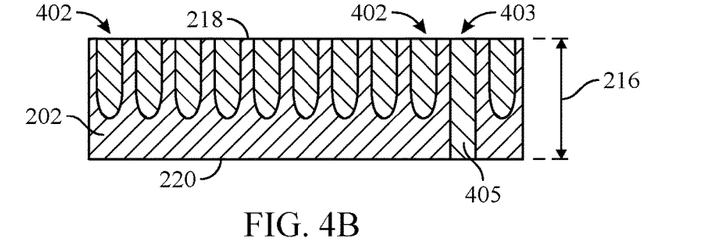

Referring to FIG. 4B, a plurality of trenches 402 may be formed in the substrate 202. In certain cases, the trenches 402 may be formed in the substrate 202 with an etching process, such as a reactive ion etching process. The trenches 402 may extend from the top surface 218 of the substrate 202 only partially through the thickness 216 of the substrate 202. In certain aspects, one or more cavities 403 may be formed through the substrate 202, such that the cavities span the thickness 216 of the substrate 202 to facilitate the formation of conductive vias (e.g., the conductive vias 206, 228). The cavities 403 may be filled with an electrically conductive material 405.

Figure 4C:
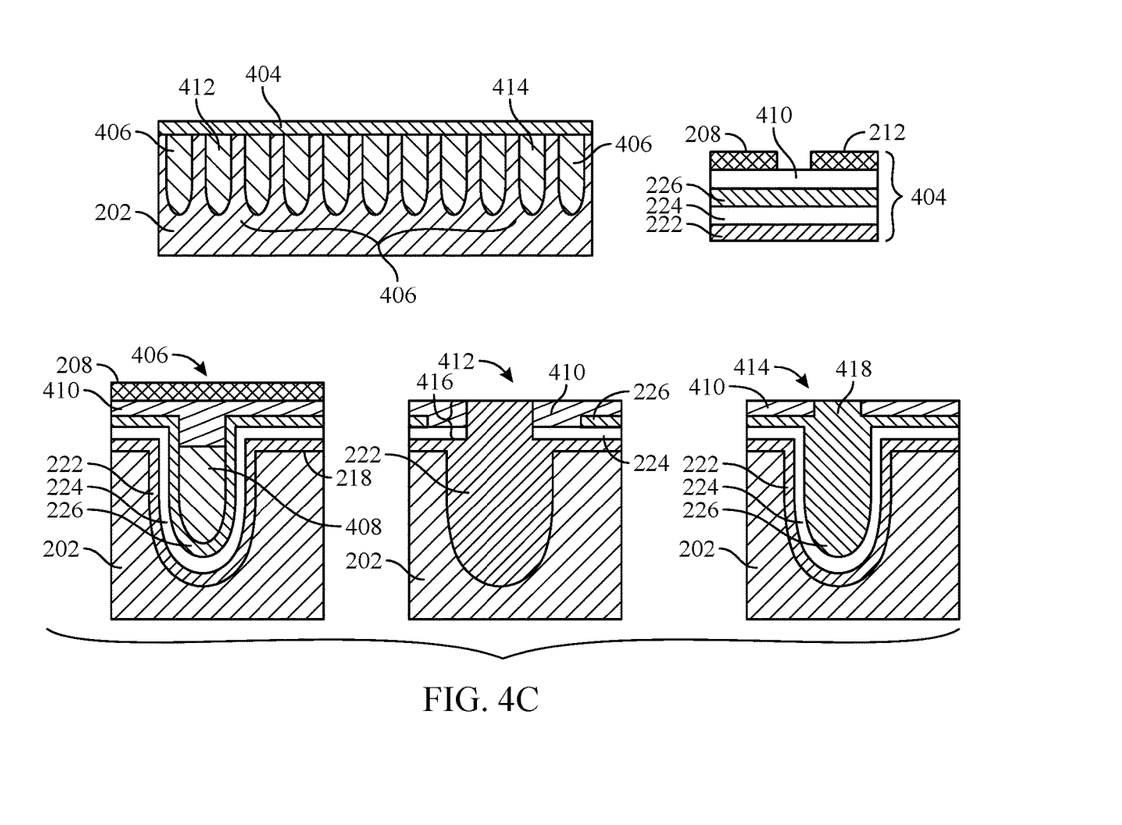

As illustrated in FIG. 4C, various layers 404 (e.g., the first conductive layer 222, first dielectric layer 224, second conductive layer 226, second dielectric layer 410, and/or conductive contacts 208, 212) may be formed in the trenches 402 and disposed above the substrate 202. For example, the various layers 404 may be formed in the trenches 402 and/or above the substrate 202 using an atomic deposition process. In aspects, a portion or all of the trenches 402 may be formed into trench capacitors 406 intersecting the substrate 202. Referring to the trench capacitor 406, the first conductive layer 222 may be formed in the trenches 402 and disposed above the top surface 218 of the substrate 202. After the first conductive layer 222 is formed, the first dielectric layer 224 may be formed over the portion of first conductive layer 222 in the trenches 402 and above the portion of the first conductive layer 222 above the top surface 218 of the substrate 202. After the first dielectric layer 224 is formed, the second conductive layer 226 may be formed over a portion of the first dielectric layer 224 in the trenches 402 and above the portion of the first dielectric layer 224 disposed above the top surface 218 of the substrate 202. The first dielectric layer 224 may be disposed between the first conductive layer 222 and the second conductive layer 226. A dielectric core 408 may be formed between the second conductive layers 226 in the trenches 402, and a second dielectric layer 410 may be formed over the second conductive layer 226.

In certain aspects, a portion of the trenches 402 may be formed into partial conductive vias 412, 414, which may be formed into conductive vias through a layer transfer process as further described herein. Referring to the partial conductive via 412, the first conductive layer 222 may be formed in a portion of the trenches 402 (e.g., at least one of the trenches 402). In certain cases, the trench of the partial conductive via 412 may be filled with the first conductive layer 222 to enable a conductive via, which is electrically coupled to the first conductive layer 222 of the trench capacitors, to be formed. A conductive pillar 416 may extend from the first conductive layer 222 and enable the first conductive layer 222 to be electrically coupled to a conductive contact (e.g., the first conductive contact 208).

Referring to the partial conductive via 414, the first conductive layer 222 and first dielectric layer 224 may be formed in a portion of the trenches 402 (e.g., at least one of the trenches 402). The trench of the partial conductive via 414 may be filled with the second conductive layer 226 to enable a conductive via, which is electrically coupled to the second conductive layer 226 of the trench capacitors, to be formed. A conductive pillar 418 may extend from the second conductive layer 226 and enable the second conductive layer 226 to be electrically coupled to a conductive contact (e.g., the third conductive contact 212).

In certain aspects, the first and third conductive contacts 208, 212 may be formed above the second dielectric layer 410. In the certain aspects, the partial conductive vias 412, 414 may take the form of the trench capacitor 406.

Figure 4D:
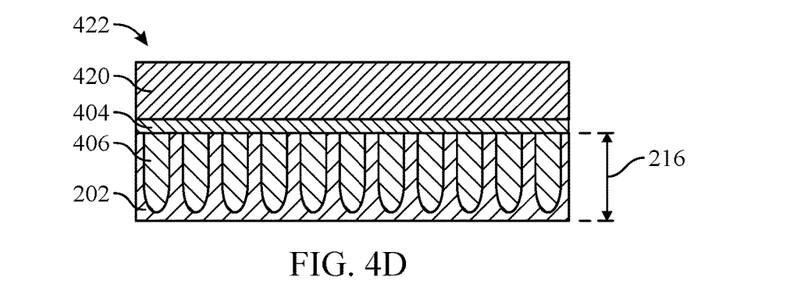

In certain aspects, the conductive vias 206 and 228 may be formed using a layer transfer process. For example, as depicted in FIG. 4D, a temporary carrier 420 (e.g., a semiconductor wafer) may be coupled (e.g., bonded) to the second dielectric layer 410 or at least one of the conductive contacts 208, 212, such that the substrate 202 and the temporary carrier 420 form a stacked (layered) structure 422. In certain aspects, the thickness 216 of the substrate 202 may be reduced, for example, using a planarization process such as a chemical mechanical planarization (CMP) process.

Figure 4E:
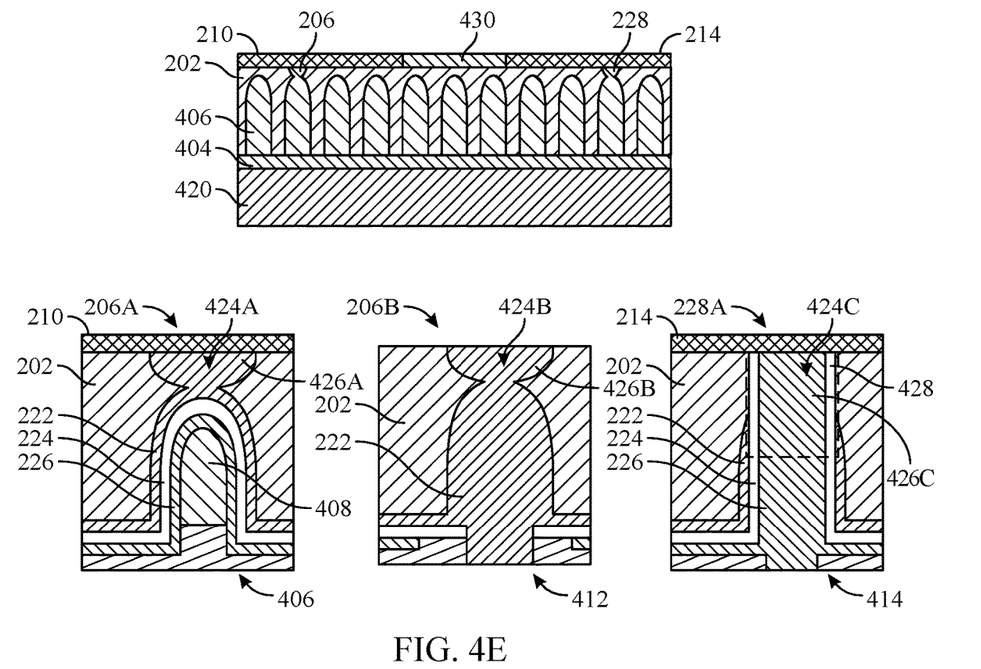

Referring to FIG. 4E, the stacked structure 422 may be inverted such that the substrate 202 is disposed above the bonded temporary carrier 420. The first conductive via 206 and/or second conductive via 228 may be formed through the substrate 202. Referring to the conductive via 206A, a cavity 424A may be formed in the substrate 202 that intersects at least a portion of the first conductive layer 222 of a trench capacitor 406, and the cavity 424A may be filled with an electrically conductive material 426A, which is coupled to the first conductive layer 222. In certain aspects, the cavity 424A may intersect at least a portion of the second conductive layer 226, and the conductive material 426A may be coupled to the second conductive layer 226 without being coupled to the first conductive layer 222. For example, a dielectric layer (not shown) may be disposed between the conductive material 426A and the first conductive layer 222 in the cavity 424A.

Referring to the conductive via 206B, a cavity 424B may be formed in the substrate 202 that intersects at least a portion of the first conductive layer 222 of the partial conductive via 412, and the cavity 424B may be filled with the electrically conductive material 426B, which is coupled to the first conductive layer 222.

Referring to the conductive via 228A, a cavity 424C may be formed in the substrate 202 that intersects at least a portion of the second conductive layer 226 of the partial conductive via 414. A third dielectric layer 428 may be formed in the cavity 424C, and the cavity 424C may be filled with the electrically conductive material 426C, which is coupled to the second conductive layer 226. The third dielectric layer 428 may be disposed between the conductive material 426C and the first conductive layer 222.

In aspects, the second conductive contact 210 and/or the fourth conductive contact 214 may be formed above the substrate 202. In this example, the second conductive contact 210 is electrically coupled to the first conductive via 206, and the fourth conductive contact 214 is electrically coupled to the second conductive via 228. In aspects, a passivation layer 430 may be formed between the conductive contacts 210, 214.

Figure 4F:
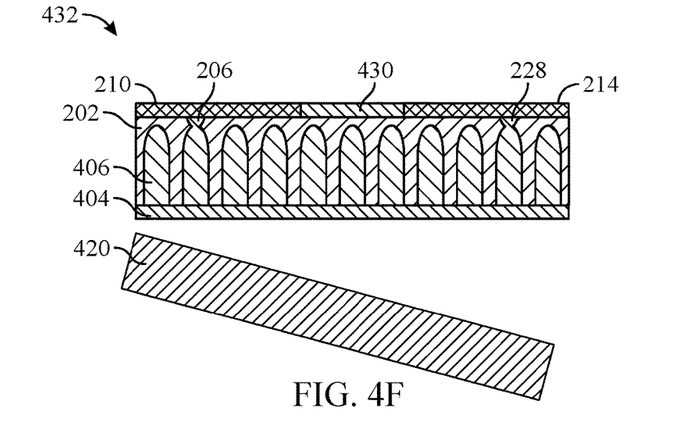

As shown in FIG. 4F, the temporary carrier 420 may be removed from the substrate 202 leaving a capacitive element 432 with conductive vias and conductive contacts as described herein with respect to FIGS. 2A-C.

Figure 5:
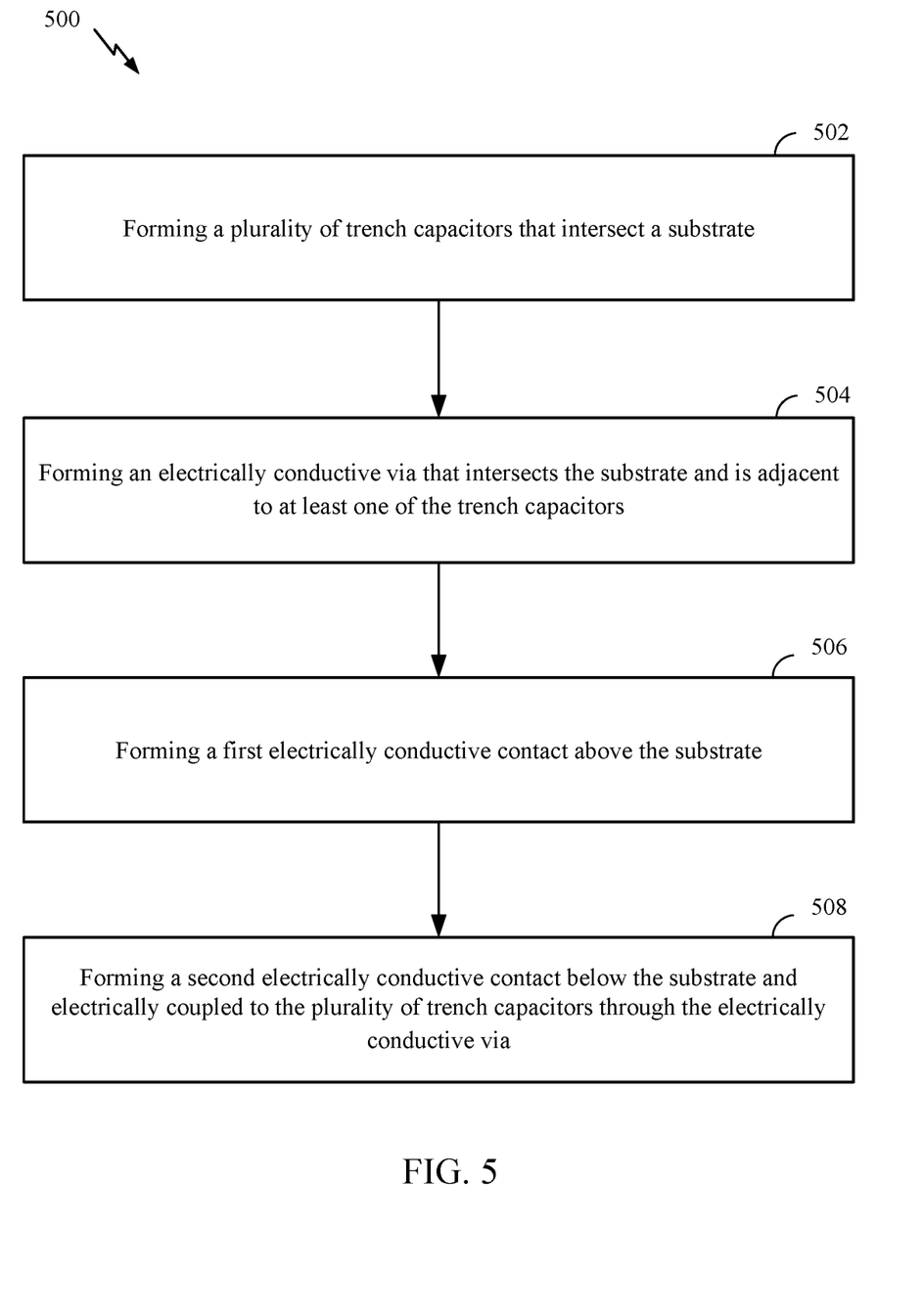
FIG. 5 is a flow diagram of example operations for fabricating a capacitive element, in accordance with certain aspects of the present disclosure.

FIG. 5 is a flow diagram of example operations 500 for fabricating a capacitive element (e.g., the capacitive element 200 depicted in FIG. 1), in accordance with certain aspects of the present disclosure. The operations 500 may be performed by a semiconductor fabrication facility, for example.

The operations 500 begin, at block 502, by forming a plurality of trench capacitors (e.g., the trench capacitors 204) that intersect a substrate (e.g., the substrate 202). At block 504, an electrically conductive via (e.g., the first conductive via 206) is formed through the substrate, such that the conductive via intersects the substrate and is adjacent to at least one of the trench capacitors. At block 506, a first electrically conductive contact (e.g., the first conductive contact 208) is formed above the substrate. At block 508, a second electrically conductive contact (e.g., the second conductive contact 210) is formed below the substrate and electrically coupled to the plurality of trench capacitors through the electrically conductive via.

In aspects, forming the plurality of trench capacitors at block 502 may include forming a plurality of trenches (e.g., the trenches 402) in the substrate. The trenches may extend from a surface (e.g., the top surface 218) of the substrate only partially through a thickness (e.g., the thickness 216) of the substrate. A first electrically conductive layer (e.g., the first conductive layer 222) may be formed in a portion of the trenches; a dielectric layer (e.g., the first dielectric layer 224) may be formed in the portion of the trenches; and a second electrically conductive layer (e.g., the second conductive layer 226) may be formed in the portion of the trenches. The dielectric layer may be disposed between the first electrically conductive layer and the second electrically conductive layer. In aspects, forming the plurality of trench capacitors at block 502 may include forming the plurality of trench capacitors with an atomic layer deposition (ALD) process. In aspects, forming the plurality of trench capacitors at block 502 includes forming the trenches with an etching process, such as a reactive ion etching (RIE) process.

In aspects, forming the conductive via at block 504 may include forming a cavity (e.g., the cavity 403) through the substrate and filling the cavity with an electrically conductive material to form the conductive via as a through-silicon via that spans a thickness of the substrate. In aspects, the conductive via is electrically coupled to the first conductive layer, the first conductive contact, and the second conductive contact. In certain aspects, the operations 500 may further include forming an additional electrically conductive via intersecting the substrate and electrically coupled to the second conductive layer. In aspects, forming the conductive via at block 504 may occur before or after forming the plurality of trench capacitors at block 502.

In certain aspects, the operations 500 may further include forming a third electrically conductive contact (e.g., the third conductive contact 212) disposed above the substrate and electrically coupled to the second conductive layer. In aspects, the operations further include forming a fourth electrically conductive contact (e.g., the fourth conductive contact 214) disposed below the substrate and electrically coupled to the second conductive layer. In aspects, the additional conductive via is electrically coupled to the third conductive contact and the fourth conductive contact.

In certain aspects, forming the first conductive contact at block 506 comprises forming a wiring layer (e.g., the conductive pads 230 or the conductive traces 232) above the trench capacitors and adjacent to the first conductive contact and wherein the wiring layer electrically couples the trench capacitors to the first conductive contact.

In certain aspects, the conductive via and/or conductive contacts may be formed using a layer transfer process that inverts the substrate for backside processing. For example, forming the conductive via at 504 or forming the second conductive contact at 508 may include bonding a temporary carrier (e.g., the temporary carrier 420) above the first conductive contact such that the substrate and the temporary carrier form a stacked structure (e.g., the stacked structure 422) and inverting the stacked structure such that the substrate is above the bonded temporary carrier. In certain cases, the second conductive contact may be formed above the substrate in the inverted stacked structure, where the second conductive contact is electrically coupled to the conductive via. In certain cases, the conductive via may be formed by forming a cavity (e.g., the cavity 424A, 424B, 424C) that intersects at least one of the trenches in the substrate and filling the cavity with an electrically conductive material, for example as described herein with respect to FIG. 4E. After forming the second conductive contact and/or the conductive via, the temporary carrier may be removed from the substrate.

In certain aspects, the capacitive element may be formed by stacking multiple capacitive elements together. For example, the operations 500 may further include coupling an additional capacitive element to the substrate. The additional capacitive element may include an additional substrate and a plurality of additional trench capacitors intersecting the additional substrate. In this case, the substrate may be disposed above the additional substrate, and the trench capacitors may be electrically coupled to the additional trench capacitors through the conductive via and the second conductive contact.

It should be appreciated that the capacitive element having conductive contacts disposed above and below a substrate as described herein may enable reduced ESR and ESL of the capacitive element due to a more effective ground plane and electrical routing through the capacitive element. With the reduced ESR and ESL, the capacitive element may improve the performance of power delivery to integrated circuits, such as the first and second dies of FIG. 1A.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A capacitive element comprising:
   a substrate;
   a plurality of trench capacitors intersecting the substrate;
   an electrically conductive via intersecting the substrate and disposed adjacent to at least one of the trench capacitors;
   a first electrically conductive contact disposed above the substrate; and
   a second electrically conductive contact disposed below the substrate and electrically coupled to the plurality of trench capacitors through the electrically conductive via.

2. The capacitive element of claim 1, wherein each of the trench capacitors comprises:
   a trench intersecting the substrate;
   a first electrically conductive layer disposed in the trench;
   a second electrically conductive layer disposed in the trench; and
   a dielectric layer disposed between the first electrically conductive layer and the second electrically conductive layer in the trench.

3. The capacitive element of claim 2, wherein the conductive via is electrically coupled to the first conductive layer, the first conductive contact, and the second conductive contact.

4. The capacitive element of claim 2, further comprising an additional electrically conductive via intersecting the substrate and electrically coupled to the second conductive layer.

5. The capacitive element of claim 4, further comprising a third electrically conductive contact disposed above the substrate and electrically coupled to the second conductive layer.

6. The capacitive element of claim 5, further comprising a fourth electrically conductive contact disposed below the substrate and electrically coupled to the second conductive layer, wherein the additional conductive via is electrically coupled to the third conductive contact and the fourth conductive contact.

7. The capacitive element of claim 1, further comprising:
   an additional substrate; and
   a plurality of additional trench capacitors intersecting the additional substrate, wherein the substrate is disposed above the additional substrate and wherein the trench capacitors are electrically coupled to the additional trench capacitors through the conductive via and the second conductive contact.

8. The capacitive element of claim 1, wherein the trench capacitors are electrically coupled in parallel with each other.

9. The capacitive element of claim 1, wherein the trench capacitors extend from a surface of the substrate only partially through a thickness of the substrate.

10. The capacitive element of claim 1, wherein the conductive via is a through-silicon via that spans a thickness of the substrate.

11. An integrated circuit (IC) package comprising the capacitive element of claim 1, wherein the capacitive element is disposed on a land side of the IC package between electrical contacts extending from a surface of the IC package.

12. The IC package of claim 11, wherein the capacitive element is electrically coupled to a power distribution network of the IC package.

13. A method of fabricating a capacitive element comprising:
   forming a plurality of trench capacitors that intersect a substrate;
   forming an electrically conductive via that intersects the substrate;
   forming a first electrically conductive contact above the substrate; and
   forming a second electrically conductive contact below the substrate, wherein:
      the electrically conductive via is adjacent to at least one of the trench capacitors; and
      the second electrically conductive contact is electrically coupled to the plurality of trench capacitors through the electrically conductive via.

14. The method of claim 13, wherein forming the plurality of trench capacitors further comprises:
   forming a plurality of trenches in the substrate, wherein the trenches extend from a surface of the substrate only partially through a thickness of the substrate;
   forming a first electrically conductive layer in a portion of the trenches;
   forming a dielectric layer in the portion of the trenches; and
   forming a second electrically conductive layer in the portion of the trenches, wherein the dielectric layer is disposed between the first electrically conductive layer and the second electrically conductive layer.

15. The method of claim 14, wherein forming the conductive via comprises:
   forming a cavity through the substrate; and
   filling the cavity with an electrically conductive material to form the conductive via as a through-silicon via that spans a thickness of the substrate, wherein the conductive via is electrically coupled to the first conductive layer, the first conductive contact, and the second conductive contact.

16. The method of claim 14, further comprising forming an additional electrically conductive via intersecting the substrate and electrically coupled to the second conductive layer.

17. The method of claim 16, further comprising forming a third electrically conductive contact disposed above the substrate and electrically coupled to the second conductive layer.

18. The method of claim 17, further comprising forming a fourth electrically conductive contact disposed below the substrate and electrically coupled to the second conductive layer, wherein the additional conductive via is electrically coupled to the third conductive contact and the fourth conductive contact.

19. The method of claim 13, wherein forming the first conductive contact comprises forming a wiring layer above the trench capacitors and adjacent to the first conductive contact and wherein the wiring layer electrically couples the trench capacitors to the first conductive contact.

20. The method of claim 13, wherein forming the second conductive contact comprises:
   bonding a temporary carrier above the first conductive contact such that the substrate and the temporary carrier form a stacked structure;
   inverting the stacked structure such that the substrate is above the bonded temporary carrier;
   forming the second conductive contact above the substrate in the inverted stacked structure, wherein the second conductive contact is electrically coupled to the conductive via; and
   removing the temporary carrier.

* * * * *